United States Patent [19]
Mori et al.

[11] Patent Number: 5,581,590
[45] Date of Patent: Dec. 3, 1996

[54] SOR EXPOSURE SYSTEM AND METHOD OF MANUFACTURING SEMICONDUCTOR DEVICES USING SAME

[75] Inventors: Makiko Mori, Atsugi; Kunitaka Ozawa; Mitsuaki Amemiya, both of Isehara, all of Japan

[73] Assignee: Canon Kabushiki Kaisha, Tokyo, Japan

[21] Appl. No.: 272,374

[22] Filed: Jul. 6, 1994

Related U.S. Application Data

[63] Continuation of Ser. No. 937,184, Aug. 31, 1992, abandoned.

[30] Foreign Application Priority Data

Sep. 3, 1991 [JP] Japan ................................. 3-222889

[51] Int. Cl.⁶ ....................................................... G21K 5/00
[52] U.S. Cl. ............................................. 378/34; 378/160
[58] Field of Search ........................................ 378/34, 160

[56] References Cited

FOREIGN PATENT DOCUMENTS

| | | |
|---|---|---|
| 3731838 | 4/1988 | Germany . |
| 63-138732 | 6/1988 | Japan . |
| 3-55800 | 3/1991 | Japan . |

OTHER PUBLICATIONS

Okada, et al., "Development of Highly Reliable Synchrotron Radiation Lithography Beamline," J. Vac. Sci. Technol. vol. B6, No. 1, Jan.–Feb., 1988, pp. 191 through 194.

Patent Abstracts of Japan, Kokai No. 02–002107, vol. 14, No. 133, Mar. 1990.

Patent Abstracts of Japan, Kokai No. 02–098121, vol. 14, No. 302, Oct. 1988.

Science Forum Co., Ltd., "A Technique for Using Synchrotron Radiation," pp. 90–94, Dec. 1989, with English translation.

*Primary Examiner*—Craig E. Church
*Attorney, Agent, or Firm*—Fitzpatrick, Cella, Harper & Scinto

[57] ABSTRACT

In an SOR exposure system for transferring patterns on masks to semiconductor wafers by using SOR radiation reflected by an X-ray reflecting mirror, a first shutter device for shielding at least γ rays and a second shutter device for shielding X-rays are provided between the SOR ring and the mirror inside a beam port, and an exposure adjustment device for adjusting the amount of exposure when a circuit pattern on a mask is transferred to a wafer is provided between the mirror and the wafer. As a result, the human body can be protected against radiation rays, such as gamma rays, generated from the SOR ring when electrons are implanted thereto or when the SOR ring is stopped. Damage to the X-ray reflecting mirror caused by radiation rays is reduced, and stable reflectance of the mirror can be obtained. Maintenance of the SOR exposure system is also made easier.

6 Claims, 11 Drawing Sheets

SOR EXPOSURE SYSTEM AND METHOD OF MANUFACTURING SEMICONDUCTOR DEVICES USING SAME

This application is a continuation of prior application Ser. No. 07/937,184 filed Aug. 31, 1992, now abandoned.

BACKGROUND OF THE INVENTION

1. Field of the Invention

The present invention relates to an SOR exposure system which uses synchrotron radiation light from an SOR ring and, more particularly, to an SOR exposure system for transferring patterns on masks onto semiconductor wafers used in the field of manufacturing semiconductor devices.

2. Description of the Related Art

The use of synchrotron radiation (hereinafter referred to as SOR radiation) as a light source for X-ray exposure has been proposed. A method has been considered in which a sheet-like beam of SOR radiation is expanded perpendicular to the plane of the beam using a mirror, and an exposure region is thereby created. In this method, as disclosed in Japanese Patent Laid-Open No. 2-98121, the damage to mirrors caused by X-rays is reduced by providing, in addition to an exposure adjustment shutter for controlling exposure time, a mirror-protective shutter for shielding X-rays disposed in a portion of the radiation path nearer to the X-ray source than the mirror, and the opening/closing of this shutter is controlled.

There has been a problem in that, in addition to X-rays, radiation rays such as $\alpha$ particles, $\beta$ particles, $\gamma$ rays, or neutrons, all of which are harmful to the human body, are generated when electrons are implanted into an SOR ring and when the SOR ring stops. As shown in FIG. 11, a method to shield these radiation rays has been proposed in which an SOR ring 1 and an exposure apparatus 2 are placed in separate chambers and a partition 6 is formed into a radiation-ray shielding wall made of, for example, concrete.

However, although the partition 6 has a duct 18 through which X-rays 3 are permitted to pass, no measures have been taken against leakage of radiation rays from the duct 18. These radiation rays are transmitted through a mirror-protective shutter provided to shield X-rays, causing damage to the mirror.

SUMMARY OF THE INVENTION

In view of the above-mentioned problems of the prior art, a primary object of the present invention is to provide an SOR exposure system which aims to protect the human body, stabilizing a mirror's reflectance for a long period of time, and to make maintenance easy.

Another object of the present invention is to provide a method of manufacturing semiconductor devices, which employs the SOR exposure system.

According to one aspect of the present invention which achieves these objectives, there is provided an SOR exposure system comprising: an SOR ring which emits SOR radiation, at least one exposure apparatus for exposing with the SOR radiation, a beam port through which the SOR ring is connected to each exposure apparatus and the SOR radiation is guided, and an X-ray reflecting mirror, disposed inside the beam port, for expanding the SOR radiation perpendicularly, wherein a first shutter means for shielding at least $\gamma$ rays and a second shutter means for shielding X-rays are provided between the SOR ring and the mirror inside the beam port.

According to a further aspect of the present invention, an SOR exposure system is provided having an SOR ring for emitting synchrotron radiation and at least one exposure apparatus. A beam port connects the SOR ring to the exposure apparatus, and a shielding wall between the SOR ring and the exposure apparatus shields harmful electromagnetic waves. A shutter is also provided in the beam port for shielding at least gamma rays.

According to yet another aspect of the present invention, a method of manufacturing semiconductor devices is provided in which an SOR ring is caused to emit synchrotron radiation. A first shutter disposed between the SOR ring and an exposure apparatus is closed to shield at least gamma rays when they are generated from the SOR ring. Also, a second shutter is opened to transfer a circuit pattern on a mask to a wafer, and the amount of X-ray exposure is adjusted during the exposure process.

According to still another aspect of the present invention, a semiconductor device is provided which is manufactured by a method in which an SOR ring is caused to emit synchrotron radiation, a first shutter disposed between the SOR ring and an exposure apparatus is closed to shield against at least gamma rays when they are generated from the SOR ring, a second shutter is opened to transfer a circuit pattern on a mask to a wafer, and the amount of X-ray exposure is adjusted during the exposure process.

With the construction described above, pernicious influence upon the human body by radiation rays, such as $\gamma$ rays, which are generated when electrons are implanted into an SOR ring and when the SOR ring stops, and damage to mirrors can be prevented. Since it is preferable that the mirror protective shutter for shielding X-rays be opened/closed each time exposure is performed, and since the shutter for shielding $\gamma$ rays is heavy because it is made of heavy metals, such as lead, the mirrors are separately disposed so that the former is light in weight and has excellent durability and the latter need not be operated at a high speed because it is designed to reliably shield radiation rays and to be opened/closed only during electron implantation. Thus, the shutters can be designed with emphasis placed on their independent functions.

Objectives and advantages in addition to those discussed above shall be apparent to those skilled in the art from the description of the preferred embodiments of the invention which follow. In the description, reference is made to the accompanying drawings, which form a part hereof, and which illustrate an example of the invention. Such example, however, is not exhaustive of the various embodiments of the invention, and therefore reference is made to the appended claims for determining the scope of the invention.

DESCRIPTION OF THE PREFERRED EMBODIMENTS

Preferred embodiments of the present invention will be explained below with reference to the accompanying drawings.

(First Embodiment)

Figure 1:
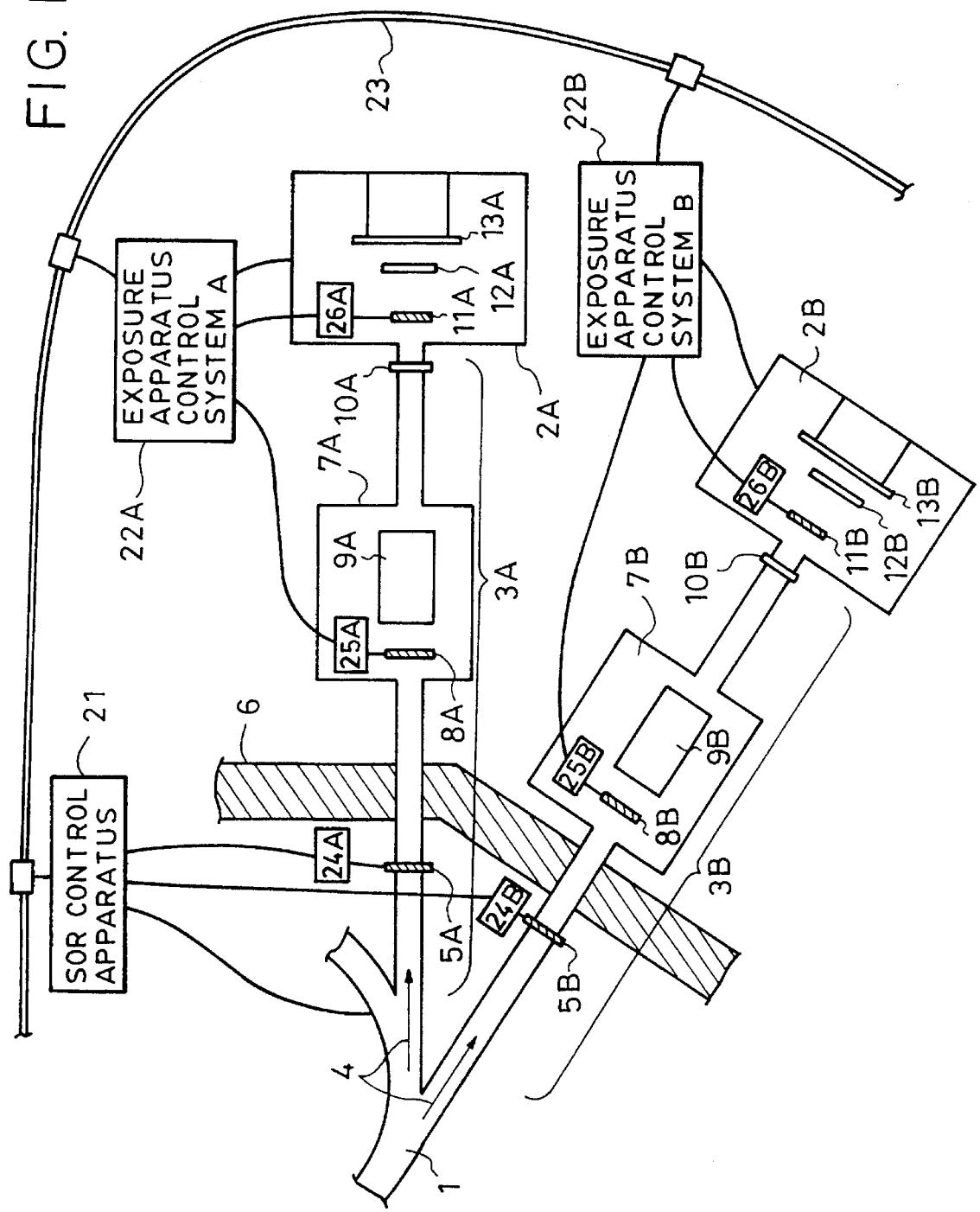
FIG. 1 is a view schematically illustrating the construction of an SOR exposure system according to an embodiment of the present invention.

FIG. 1 is a view schematically illustrating the construction of an embodiment of an SOR exposure system used to manufacture semiconductor devices. Shown in this figure are exposure apparatuses 2A and 2B which perform exposure by using a single SOR ring. Since the exposure apparatuses have the same construction, reference letters A and B are given after the same reference numerals for the same components, and an explanation will be given only about those components designated by letter A. In practice, a great number of exposure apparatuses are disposed around the SOR ring, though they are not shown.

In FIG. 1, reference numeral 1 denotes an SOR ring which emits SOR radiation; reference numeral 2A denotes an exposure apparatus for performing exposure; and reference numeral 3A denotes a beam port through which the SOR ring 1 is connected to the exposure apparatus 2A and SOR radiation 4 is guided from the SOR ring 1 to the exposure apparatus 2A.

Disposed in the beam port 3A are, in order from the SOR ring 1, a first shielding means, such as a lead shutter 5A, for shielding radiation rays, such as α particles, β particles, γ rays, or neutrons; a second shielding means, such as a mirror-protective shutter 8A, for shielding X-rays; an X-ray mirror 9A for reflecting and expanding SOR radiation 4 and for irradiating with X-rays the regions where exposure is required; and a window 10A which separates the ultra-high vacuum atmosphere of a mirror chamber 7A from the atmosphere (e.g., pressure-reduced He atmosphere) inside the exposure apparatus 2A and which shields the exposure apparatus 2A from electromagnetic waves generated by the SOR ring 1 which are detrimental to exposure. The mirror-protective shutter 8A and the X-ray mirror 9A are arranged inside the mirror chamber 7A in an ultra-high vacuum. The shielding wall 6 through which the beam port 3A passes is disposed in the vicinity of the lead shutter 5A.

Disposed inside the exposure apparatus 2A is an exposure adjustment shutter 11A for controlling the amount of X-ray exposure when a circuit pattern on a mask 12A is transferred to a wafer 13A by using SOR radiation 4 expanded by the X-ray mirror 9A.

Next, the control system of the SOR exposure system will be explained.

Reference numeral 21 denotes an SOR control apparatus for controlling the SOR ring 1. It also controls the opening/closing of the lead shutter 5A via a lead shutter drive section 24A. Reference numeral 22A denotes an exposure apparatus control system A for controlling the exposure apparatus 2A. It also controls the opening/closing of the mirror-protective shutter 8A via a mirror-protective shutter drive section 25A and the opening/closing of the exposure adjustment shutter 11A via an exposure adjustment shutter drive section 26A. Reference numeral 23 denotes a communication system through which the SOR control apparatus 21 is connected to each of the exposure apparatus control systems 22, which communication system may be connected by communication lines with the SOR as the center or may be formed by a local area network (LAN).

Figure 2:
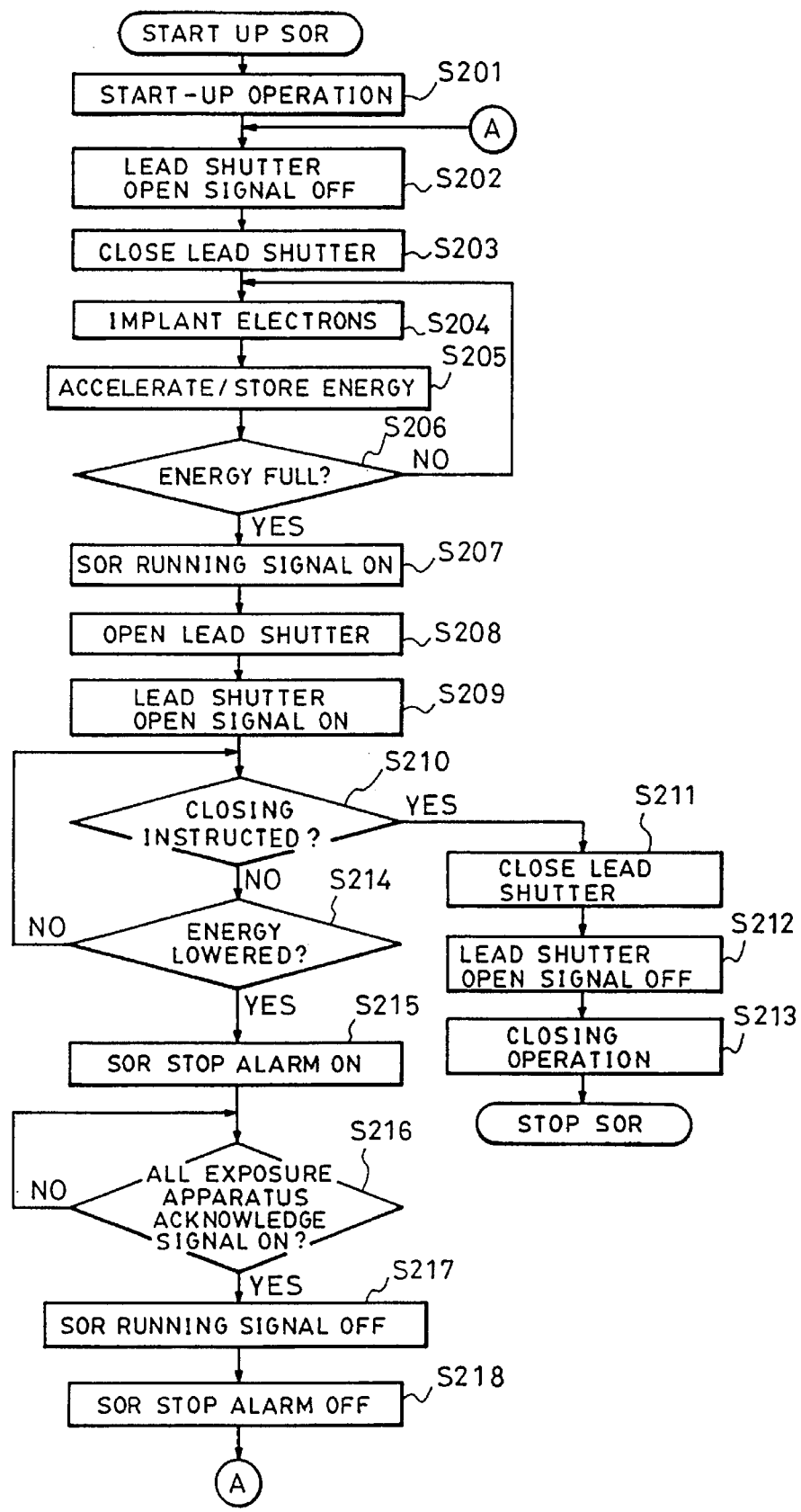
FIG. 2 is a flowchart showing the sequence of the operation of the SOR exposure system according to the embodiment of the present invention.

FIG. 2 is a flowchart showing the sequence of the operation of the SOR control apparatus 21 according to a first embodiment of the present invention.

Referring to the flowchart shown in FIG. 2, in step S201, a start-up operation, such as initialization, evacuation into a vacuum, or self-diagnosis, is performed. In the subsequent step S202, a lead-shutter close signal (a lead-shutter open signal in the OFF condition) for all the beam ports is output, and the lead shutters 5 of all the beam ports are closed in step S203. Then, electron implantation, energy acceleration, and energy storage are performed until the SOR ring 1 reaches full energy in steps S204 to S206. When full energy is reached, an SOR running signal is output to each exposure apparatus control system 22, the lead shutter 5 of each beam port is opened, and a corresponding lead-shutter open signal is output in steps S207 to S209. At this time, the SOR control apparatus 21 need not know whether or not each of the beam ports is used. It is only necessary that the lead shutter 5 is reliably closed at implantation time when radiation rays are generated.

With the apparatus ready to enter a normal running state, in step S210, a check is made to determine whether a closing command has been issued from the operator. If it has been issued, the lead shutter is closed, the lead shutter open signal is turned off, the closing operation is performed, and the SOR is stopped (steps S211 to S213). If no closing command has been issued, a check is made in step S214 whether the energy is lowered. If the energy has not been lowered, the process returns to step S210 and normal operation is continued. If, however, the energy has been lowered, an SOR stop alarm is output to each exposure apparatus control system 22 in step S215. The SOR waits until SOR stop acknowledge signals are received from all running exposure apparatus control systems 22. Thereafter, the SOR running signal is turned off, and the SOR stop alarm is also turned off in steps S216 to S218. Then, the process returns to step S202, and electron implantation/acceleration is restarted.

Figure 3:
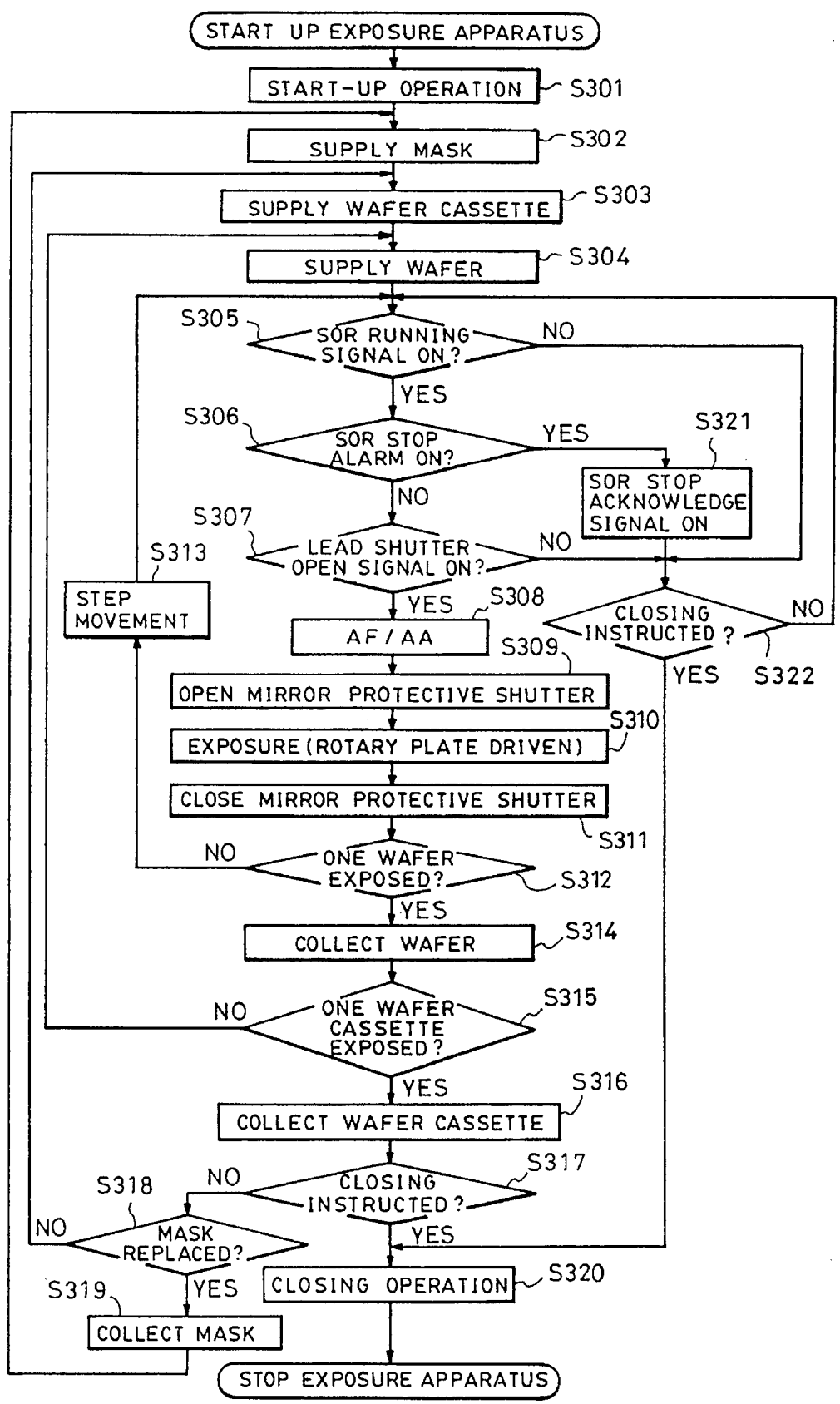
FIG. 3 is a flowchart showing the sequence of the operation of an exposure apparatus system according to the embodiment of the present invention.

Next, the sequence of the operation of the exposure apparatus control system 22 will be explained with reference to the flowchart shown in FIG. 3. Although the operation of a single exposure apparatus control system is shown in FIG. 3, exactly the same operation applies to the other exposure apparatus control systems. Referring to the flowchart shown in FIG. 3, in step S301 a start-up operation, such as initialization, self-diagnosis or atmosphere control, is performed. In steps S302 to S304, a mask 12 and a wafer 13 are supplied to their respective stages.

Steps S305 to S311 indicate an exposure operation for one shot. It is confirmed whether the SOR running signal is ON, the SOR stop alarm is OFF, and the lead-shutter open signal for the beam port being used is ON. Then, auto-focus (AF) and auto-alignment (AA) are performed so as to position the mask 12 and the wafer 13 in a predetermined relationship. After the mirror-protective shutter is opened, the exposure operation is performed.

Figure 4:
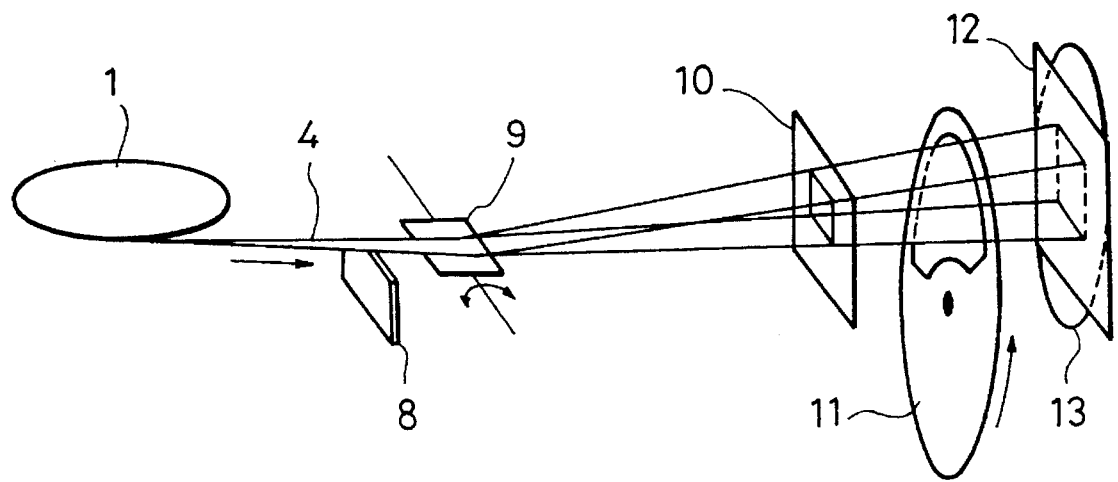
FIG. 4 is a view schematically illustrating the construction of an X-ray mirror and an exposure-amount adjustment shutter according to the embodiment.

FIG. 4 shows an example in which a swinging mirror 9 and a rotary plate 11 are used for one embodiment of the X-ray reflecting mirror 9 and the exposure adjustment shutter 11. The swinging mirror 9 is designed to expand SOR radiation 4 perpendicularly by swinging the mirror 9. The X-ray reflectance differs depending upon the reflection angle. According to this figure, the X-ray intensity becomes weaker toward the upper portion. Since an opening of the rotary plate 11 is provided to compensate for the variation of intensity, all that is necessary for an actual exposure operation is that the rotary plate 11 be rotated by means of the exposure adjustment shutter drive section 26 and stopped by the radiation shielding section.

Upon termination of a one-shot exposure, a check is made in step S312 to determine whether all shot exposures for one wafer have been terminated. If they have not, the wafer is moved by steps to the next shot in step S313, and the process returns to step S305 and the next shot exposure is performed. If the exposure for one wafer has been terminated, the exposed wafer is collected in step S314. In the subsequent step S315, a check is made to determine whether all wafers inside the wafer cassette have been completely exposed. If all wafers have not been completely exposed, the process returns to step S304, and the next wafer is exposed.

If exposure for one wafer cassette has been terminated, the exposed wafer cassette is collected in step S316. In the subsequent step S317, a check is made to determine whether a closing command has been issued from the operator. If it has not been issued, a check is made in step S318 whether a command has been given for replacing the mask. If no command has been given, the process returns directly to step S303. If a command has been given, the mask 12 is collected in step S319. Then, the process returns to step S302 and the next wafer-cassette exposure operation is performed. If the closing command has been issued in step S317, the closing operation is performed in step S320 and the exposure apparatus is stopped.

When the SOR ring 1 is at rest and no SOR running signal has been output, the process branches from step S305 to S322 where a check is made to determine whether the command for closing the exposure apparatus has been issued from the operator. If the command has been issued, the closing operation is performed in step S320 and the exposure apparatus is stopped. If no command has been issued, the process returns to step S305 where it waits for the SOR ring 1 to be recovered. If the SOR stop alarm has been output because the energy is lowered, the process branches from step S306 to S321 where an SOR stop acknowledge signal is output to the SOR control apparatus 21. Then, the process proceeds to step S322, at which step and subsequent steps the above-described operations are performed. When the process branches from step S307 to step S322 because the lead shutter is closed, the operations beginning at step S322 are performed similarly to those described above.

(Second Embodiment)

Figure 5:
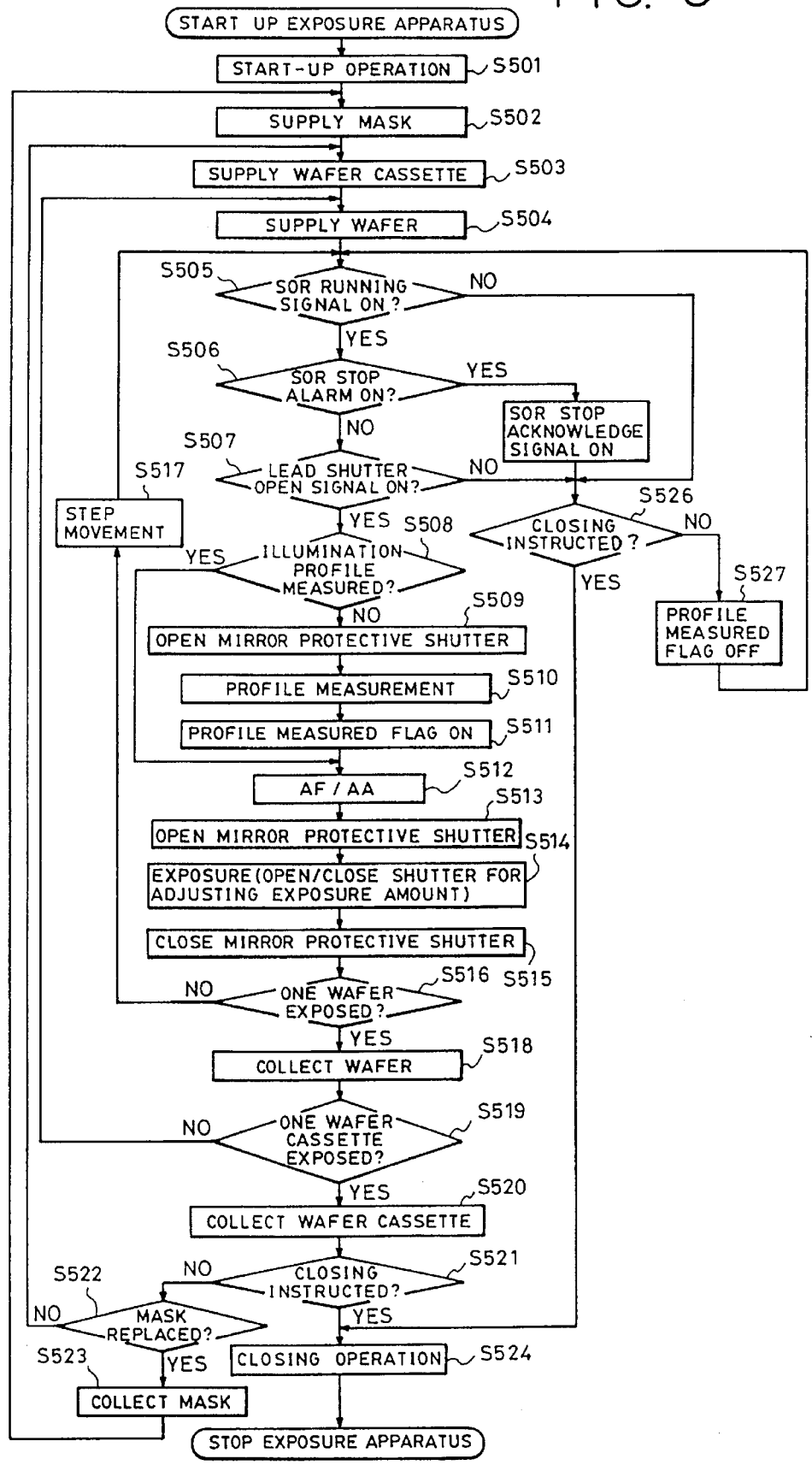
FIG. 5 is a flowchart showing another sequence of the operation of the exposure apparatus system according to the embodiment of the present invention.

Next, the operation of the exposure apparatus control system 22 according to a second embodiment will be explained with reference to the flowchart shown in FIG. 5.

Steps S501 to S507 are the same as steps S301 to S307 shown in FIG. 3. In step S508, a check is made to determine whether the illumination profile of the SOR light 4 has been measured. If it has been measured, the process proceeds directly to step S512. If the measurement has not been performed, the mirror-protective shutter is opened, and the illumination profile is measured (steps S509 to S511).

Figure 6:
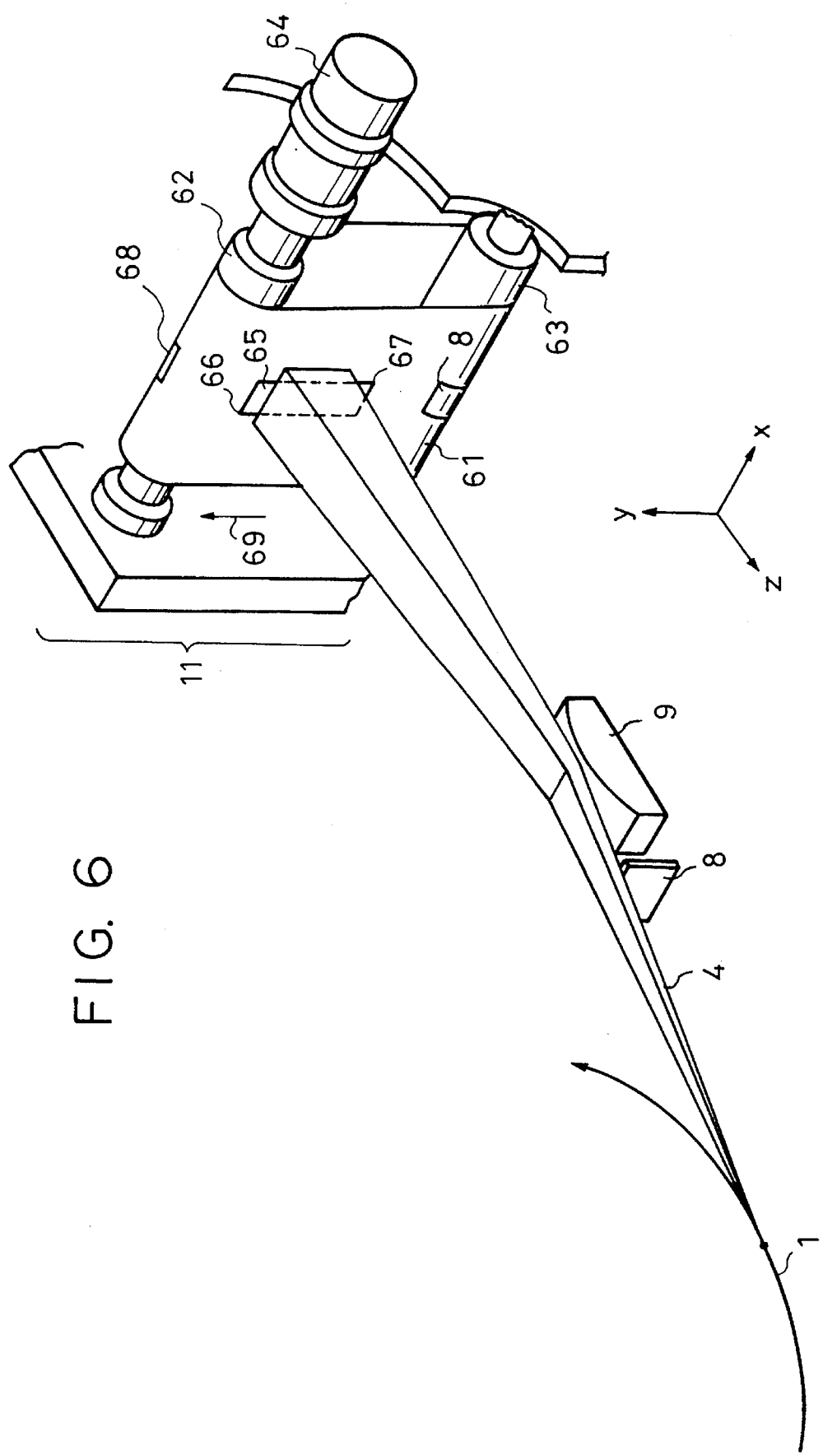
FIG. 6 is a view schematically illustrating the construction of the X-ray mirror and the exposure-amount adjustment shutter according to the embodiment shown in FIG. 5.
Figure 7:
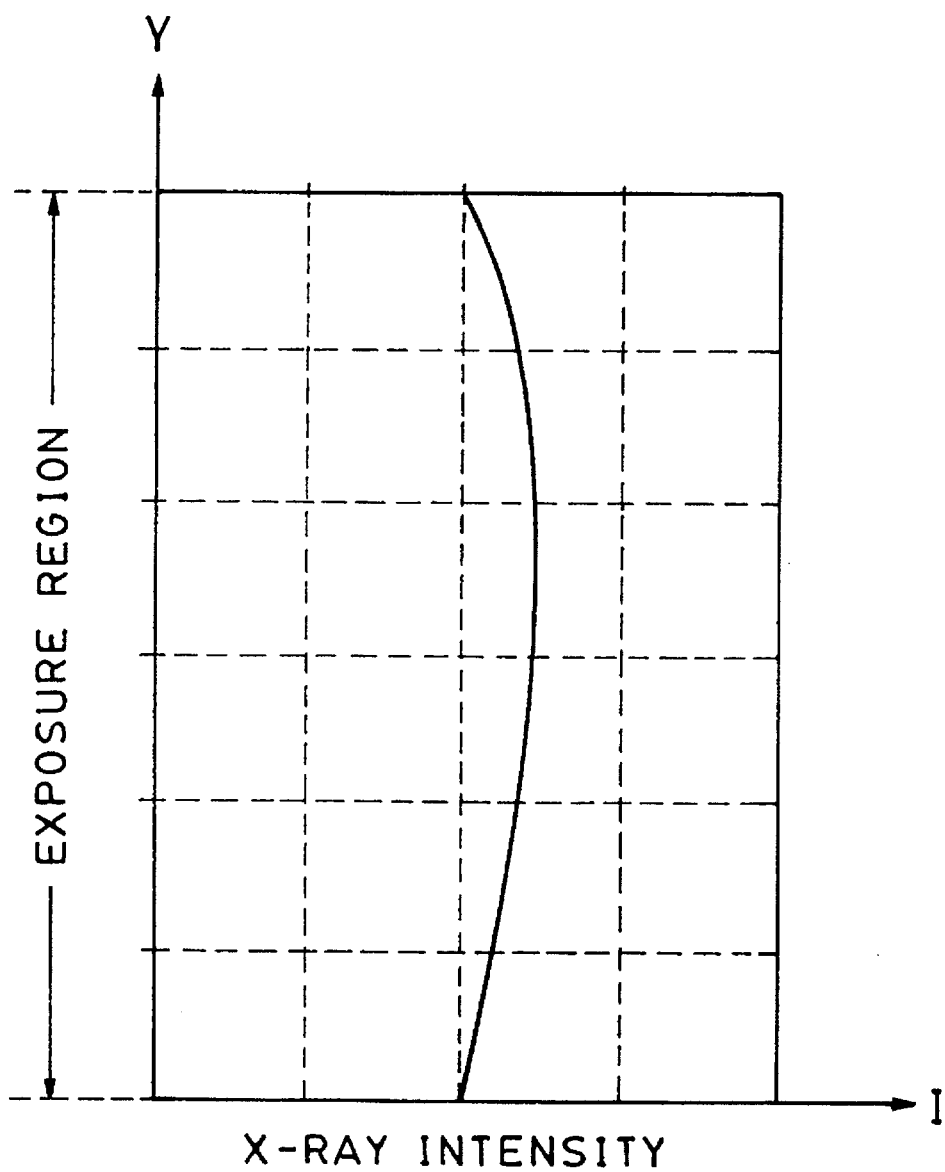
FIG. 7 is a graph showing the intensity distribution of X-rays irradiated onto a wafer according to the embodiment shown in FIG. 5.

Profile measurements will now be explained in detail with reference to FIG. 6. FIG. 6 is a view schematically illustrating the construction in a case when a curved mirror is used as an embodiment of the X-ray mirror 9. A wide-width belt having an opening and which is stretched across two cylindrical drums is used as an embodiment of the exposure adjustment shutter 11. The illustration of those components behind the exposure adjustment shutter 11 is omitted. Those components shown in FIG. 6 which are the same as those components shown in FIG. 1 are given the same reference numerals. In FIG. 6, reference numeral 61 denotes a belt; reference numeral 62 denotes a drive drum; reference numeral 63 denotes an idle drum; reference numeral 64 denotes an actuator for rotating the drive drum 62; reference numeral 65 denotes an opening for controlling exposure; reference numeral 66 denotes a leading edge of the opening 65 for controlling exposure; reference numeral 67 denotes a trailing edge of the opening 65 for controlling exposure; reference numeral 68 denotes an opening on the rear side; and reference numeral 69 denotes a direction in which the belt 61 is moved. SOR light 4 emitted from the SOR ring 1 is a sheet beam which is uniform in the X direction (the horizontal direction) and which has an extremely thin Gaussian distribution in the Y direction (the vertical direction). When the SOR light 4 is expanded in the Y direction by using a cylindrical mirror, the intensity distribution of X-rays irradiated onto the wafer 13 is as shown in FIG. 7. This nonuniform distribution is measured in step S510 in FIG. 5, and a flag indicating that the profile has been measured is turned on in step S511.

At this point, the mirror-protective shutter may be closed, but is not necessarily closed in this embodiment because an exposure operation will be performed soon. In steps S512 to S514, auto-focus (AF) and auto-alignment (AA) are performed in the same manner as in the previous embodiment, the mirror-protective shutter is opened, and then the exposure operation is performed. As regards the exposure operation, the exposure adjustment shutter 11A is driven via the exposure-adjustment shutter drive section 26 according to the driving method calculated on the basis of the illumination profile of the SOR radiation 4. To be more specific, the belt 61 of the exposure adjustment shutter is driven at variable speeds on the basis of the measurement results in step S510 so that the photosensitivity of a resist applied on the wafer 13 becomes uniform. That is, the time period (exposure time) from the time the leading edge 66 of the opening 65 for controlling exposure passes a point Y until the trailing edge 67 passes the point is controlled.

If it is assumed in this method that the direction of the movement of the belt 61 is fixed to one direction and exposure control is performed only when the opening 65 for controlling exposure is on the front side in FIG. 6, the belt 61 must be returned to its original exposure starting position after one shot exposure. Since there is also a possibility that the opening 65 for controlling exposure and the opening 68 on the rear side will be open at the same time during the returning operation, X-rays must not be irradiated to the exposure adjustment shutter 11A during the returning operation. Therefore, in this embodiment, after the mirror-protective shutter 8 is closed in step S515 in FIG. 5, the belt 61 of the exposure adjustment shutter 11 is returned during the step movement in step S517 or during the collection of the wafer in step S518. In this embodiment, the mirror-protective shutter 8 serves not only to protect the mirror but also as an auxiliary shutter for shielding unwanted exposure.

Steps S515 to S526 are the same as steps S311 to S322 shown in FIG. 3. However, in this embodiment, an operation for turning off the profile measured flag is performed in step S527 since the illumination profile is measured when electrons are implanted into the SOR ring.

The present invention is not limited to the above-described arrangement, but various modifications can be made.

Although in the above-described embodiment, the mask is replaced after the wafer cassette is collected, it is also possible to replace the mask before all wafers of the wafer cassette have been completely exposed.

Although lead shutters have been described as the first shielding means, above-mentioned materials for shielding radiation rays, such as α particles, β particles, γ rays, or neutrons, may be selected, or metals, such as tungsten, iron, stainless steel, or copper, may be used.

Lead shutters may be disposed upstream or downstream of the shielding wall, but it is a prerequisite that no angle exists in which radiation from the SOR ring 1 can bypass both the shielding wall and the lead shutter and be transmitted outside of the exposure chamber.

Figure 8:
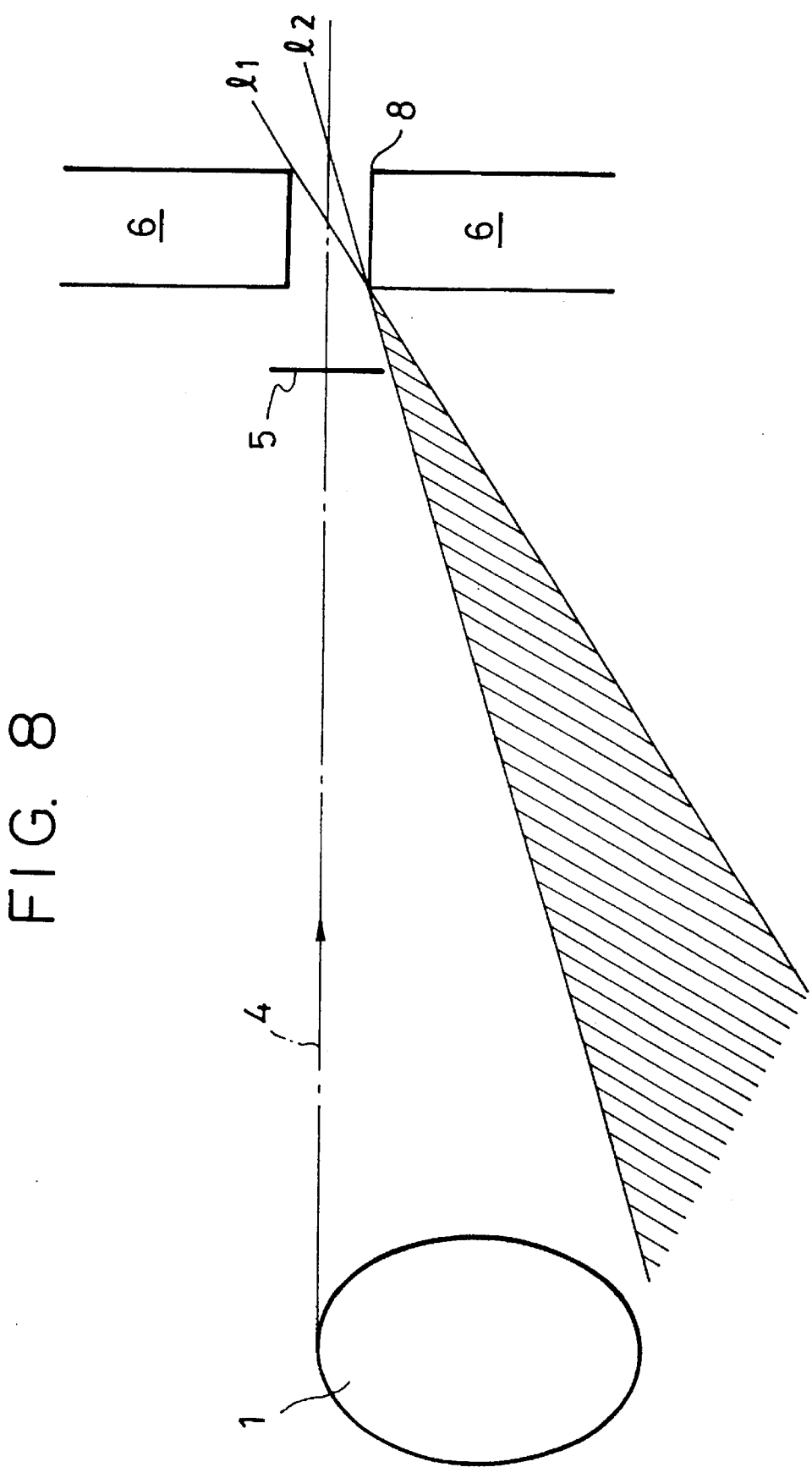
FIG. 8 is a view showing the position where a lead shutter is placed.

As shown in FIG. 8, if a line formed by extending a line which diagonally connects the duct 8 of the partition wall 6 is denoted as $l_1$, and a line formed by extending a line which connects the end of the lead shutter 5 to the nearest end of the duct 6 from that end is denoted as $l_2$, the region (the shaded portion) having a shallower angle than that of $l_1$ and a deeper angle than that of $l_2$ can be seen from the exposure chamber. Therefore, it may be said that the aforesaid condition is satisfied if the lead shutter is placed so that the SOR ring 1 does not exist in this portion.

According to the above-described embodiment in which the lead shutter is disposed between the SOR ring and the mirror in the beam port and these are controlled from the SOR control apparatus, radiation rays, such as gamma rays, generated when electrons are implanted into the SOR ring or the SOR ring is stopped, can be reliably shielded without taking into account whether the exposure apparatus is being operated. Thus, this embodiment has advantages in that influences upon the human body can be eliminated, damage to the mirror can be reduced, the mirror's reflectance can be stabilized for a long period of time and the maintenance thereof can be made easier. Since the functions of respective shutters are clearly separate, optimum design with emphasis placed on functions is made possible.

(Third Embodiment)

An explanation will be given below about the third embodiment of a method for manufacturing semiconductor devices by using the SOR exposure system described above.

Figure 9:
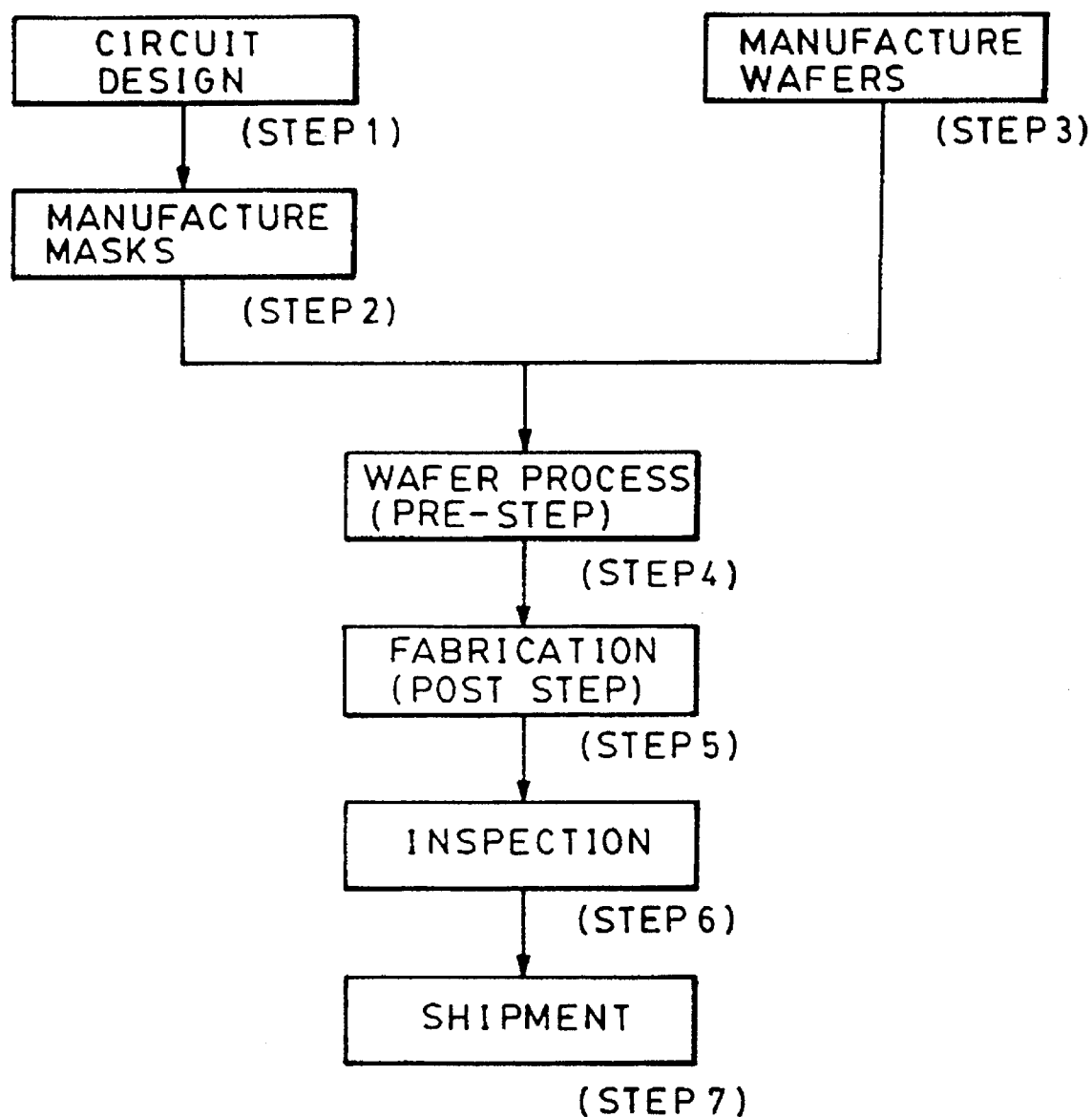
FIG. 9 is a flowchart showing the operation of manufacturing semiconductor devices.

FIG. 9 is a flowchart showing the sequence of the operation of manufacturing semiconductor devices (semiconductor chips, such as ICs or LSIs, liquid-crystal panels, or CCDs).

Referring to the flowchart shown in FIG. 9, in step 1 (circuit design), circuits of semiconductor devices are designed. In step 2 (manufacture of masks), masks having designed circuit patterns formed thereon are manufactured. In step 3 (manufacture of wafers), wafers are manufactured by using materials, such as silicon. Step 4 (wafer process) is called a pre-step, whereby actual circuits are formed on wafers by lithography technology by using the masks and wafers produced as described above. The subsequent step 5 (fabrication) is called a post step, whereby semiconductors are formed into chips by using the wafers manufactured in step 4. This step includes an assembly step (dicing, bonding), a packaging step (enclosing chips), and the like. In step 6 (inspection), inspection, for example, a test for confirming the operations of semiconductor devices manufactured in step 5, or a durability test, is performed. Semiconductor devices are completed through the processes described above and shipped (step 7).

Figure 10:
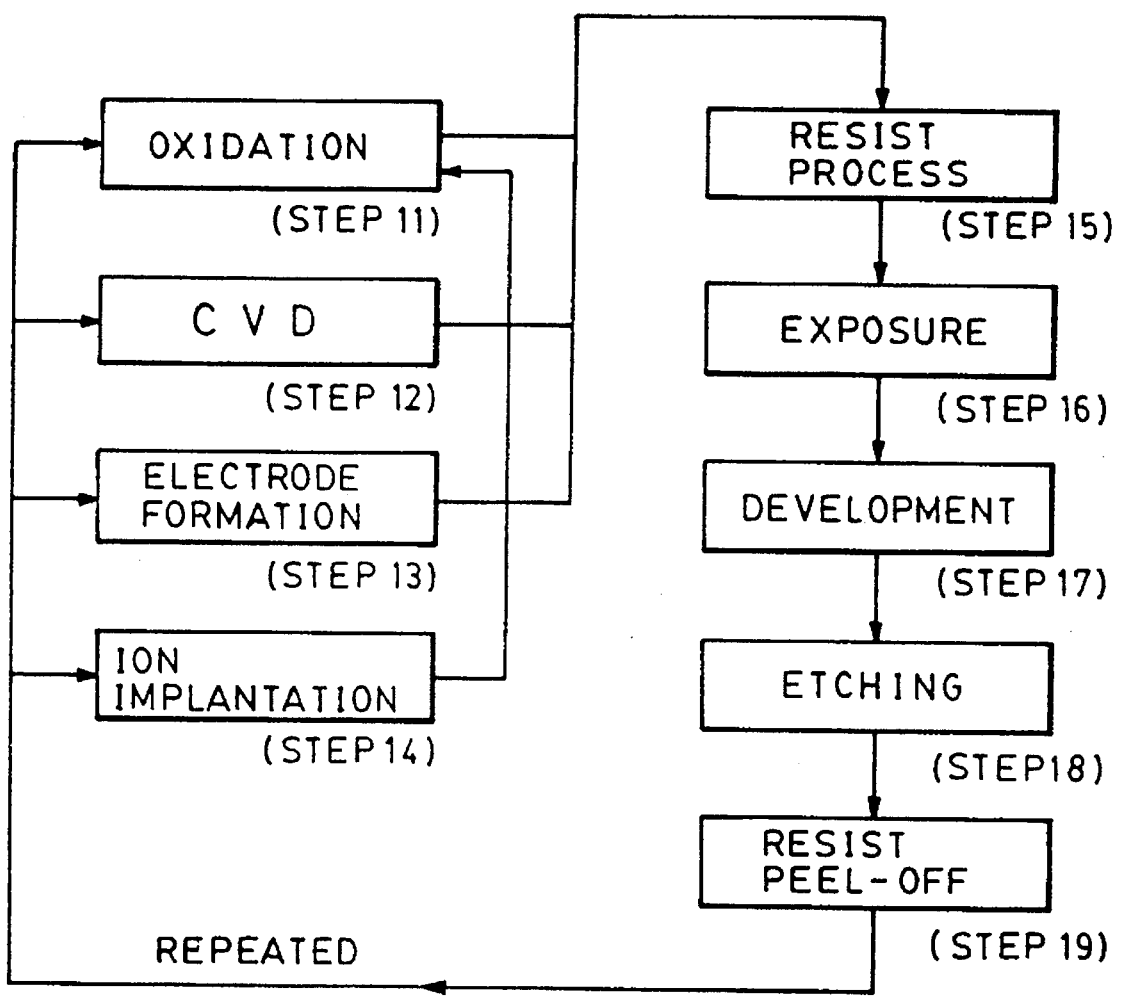
FIG. 10 is a flowchart showing the operation for processing wafers.
Figure 11:
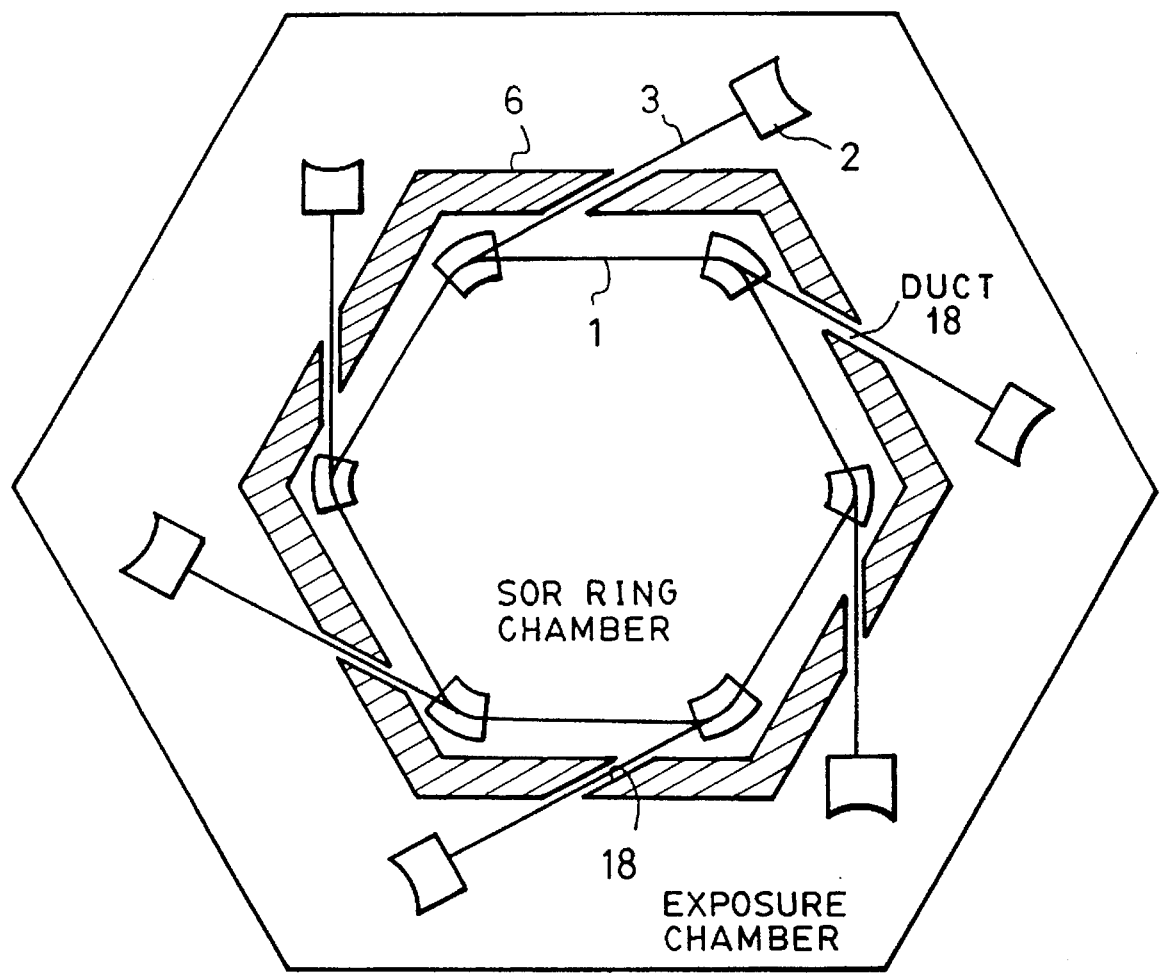
FIG. 11 is a schematic view showing the chamber arrangement of a conventional SOR exposure system.

FIG. 10 shows a detailed flowchart for the wafer process. In step 11 (oxidation), the surface of the wafer is oxidized. In step 12 (CVD), an insulating film is formed on the surface of the wafer. In step 13 (electrode formation), electrodes are formed on the wafer by deposition. In step 14 (ion implantation), ions are implanted into the wafer. In step 15 (resist process), a photosensitizing agent is applied to the wafer. In step 16 (exposure), a circuit pattern of the mask is printed and exposed to the wafer by means of the SOR exposure system of the above-described embodiment. In step 17 (development), the exposed wafer is developed. In step 18 (etching), portions other than the developed resist image are etched. In step 19 (resist peel-off), resists which become unnecessary after etching is performed are removed. Circuit patterns are formed on the wafer in a multi-form by performing these steps repeatedly.

The individual components shown in outline or designated by blocks in the Drawings are all well-known in the SOR exposure system arts, and their specific construction and operation are not critical to the operation or best mode for carrying out the invention.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded a broad interpretation, so as to encompass all such modifications and equivalent structures and functions.

What is claimed is:

1. An SOR exposure system, comprising:

an SOR ring for emitting synchrotron radiation;

an exposure apparatus for performing exposure by using the synchrotron radiation;

a shielding wall, disposed between the SOR ring and the exposure apparatus, for shielding harmful electromagnetic waves from the SOR ring;

a beam port for connecting the SOR ring and the exposure apparatus through the shielding wall;

an X-ray reflecting mirror, disposed in the beam port, for reflecting the synchrotron radiation;

a first shutter, disposed between the SOR ring and the mirror, for shielding at least γ-rays included in the synchrotron radiation during a start-up operation of the SOR ring in which electrons are injected to the SOR ring, wherein the first shutter is arranged such that no angle exists in which radiation from the SOR ring can pass both the shielding wall and the first shutter, and that no position on the exposure apparatus side of the shielding wall exists from which the SOR ring can be seen;

a second shutter, disposed between the first shutter and the mirror, for shielding X-rays included in the synchrotron radiation, to protect the mirror prior to an exposure process, wherein the first shutter is heavier and has a shielding capacity higher than the second shutter;

a third shutter, disposed in the exposure apparatus, for shielding X-rays, to adjust the exposure period during an exposure process;

a first control apparatus for controlling the SOR ring and the first shutter, the first control apparatus closing the first shutter during a start-up operation of the SOR ring in which electrons are injected to the SOR ring and opening the first shutter during an exposure process; and a second control apparatus for controlling the exposure apparatus, the second shutter and the third shutter, the second control apparatus opening the second shutter during the exposure process and adjusting the exposure period during the exposure process by using the third shutter.

2. An SOR exposure system according to claim 1, wherein the first control apparatus places the first shutter in a non-transmissive state when γ rays are generated from the SOR ring, and the second control apparatus places the second shutter in a transmissive state when an exposure operation is performed.

3. An SOR exposure system according to claim 1, wherein the at least one exposure apparatus comprises means for exposing a circuit pattern of a semiconductor device, formed on an X-ray mask, to a wafer.

4. An SOR exposure system according to claim 1, wherein said mirror is a convex mirror for expanding the synchrotron radiation.

5. An SOR exposure system according to claim 1, further comprising exposure adjustment means, disposed between said mirror and an object to be exposed, for controlling the amount of exposure.

6. An SOR exposure system according to claim 1, wherein a plurality of said exposure apparatuses are arranged around the SOR ring.

* * * * *

UNITED STATES PATENT AND TRADEMARK OFFICE
CERTIFICATE OF CORRECTION

PATENT NO. : 5,581,590
DATED : December 3, 1996
INVENTOR(S) : Makiko MORI, et al.

It is certified that error appears in the above-indentified patent and that said Letters Patent is hereby corrected as shown below:

<u>COLUMN 1</u>:

Line 12, "light" should be deleted; and
Line 19, "light" should read --radiation--.

Signed and Sealed this

Twenty-ninth Day of April, 1997

*Attest:*

BRUCE LEHMAN

*Attesting Officer*   Commissioner of Patents and Trademarks